United States Patent [19]
Shiga

[11] Patent Number: 5,240,546
[45] Date of Patent: Aug. 31, 1993

[54] APPARATUS FOR PEELING SEMICONDUCTOR SUBSTRATE

[75] Inventor: Nobuo Shiga, Yokohama, Japan

[73] Assignee: Sumitomo Electric Industries, Ltd., Osaka, Japan

[21] Appl. No.: 872,996

[22] Filed: Feb. 24, 1992

[30] Foreign Application Priority Data

Apr. 26, 1991 [JP] Japan .................................. 3-96900

[51] Int. Cl.$^5$ .............................................. B32B 31/00
[52] U.S. Cl. .................................... 156/378; 156/350;
156/584; 51/131.5; 73/768; 437/225
[58] Field of Search ............... 156/154, 155, 344, 378,
156/584, 350, 64, 358; 51/216 R, 236, 272,
131.4, 131.5, 216 LP, 283 R; 269/7, 289 R, 903;
437/225, 946; 73/760, 763, 768, 150 A

[56] References Cited

U.S. PATENT DOCUMENTS

| | | | |
|---|---|---|---|
| 3,634,930 | 1/1972 | Cranston | 29/574 |
| 4,433,835 | 2/1984 | Wheeler | 269/14 |
| 4,519,168 | 5/1985 | Cesna | 51/216 LP |
| 4,893,513 | 1/1990 | Schroeder et al. | 73/827 |
| 5,013,392 | 5/1991 | Virgadamo | 156/584 |
| 5,170,929 | 12/1992 | Long et al. | 228/102 |

FOREIGN PATENT DOCUMENTS 146197 6/1985 European Pat. Off. .

Primary Examiner—David A. Simmons
Assistant Examiner—Paul M. Rivard
Attorney, Agent, or Firm—Beveridge, DeGrandi, Weilacher & Young

[57] ABSTRACT

There is disclosed an apparatus for peeling a semiconductor substrate includes an unit for fixing a reinforcing plate bonded to the semiconductor substrate, a mechanism for pushing the semiconductor substrate bonded to the reinforcing plate in a direction parallel to a bonding surface, a unit for monitoring a stress generated by the semiconductor substrate, and a controller for controlling a driving unit of the pushing mechanism of the semiconductor substrate in accordance with the monitored stress.

19 Claims, 4 Drawing Sheets

APPARATUS FOR PEELING SEMICONDUCTOR SUBSTRATE

BACKGROUND OF THE INVENTION

1. Field of the Invention

The present invention relates to an apparatus for peeling a wafer on which semiconductor elements are formed from a reinforcing plate which is bonded to the wafer for increasing the mechanical strength of the wafer. The peeling is performed in the end of the manufacture of a semiconductor wafer having a monolithic microwave integrated circuit used in microwave and milliwave ranges as an MMIC (Microwave Monolithic Integrated Circuit) thereon.

2. Related Background Art

In recent rapid developments of information network systems, strong demand for satellite communication and broadcasting systems have arisen, and the frequency bands are gradually being shifted to higher frequencies. Under these circumstances, extensive studies on MMICs for a variety of practical applications and mainly military and special industrial applications are also shifted to those for commercial applications. While these MMICs include "uniplanar" type MMICs which do not require a thin substrate, generally, various methods for forming wiring lines using microstrip lines are proposed.

In an MMIC formed by the above methods, the thinning of the thickness of a wafer(substrate) causes following advantages.

① a microstrip line for the same characteristic impedance can have a smaller width, thereby obtaining a compact MMIC; and ② an etching time for forming via holes can be shortened to minimize variations in shapes of via holes.

For these reasons, the thickness of the wafer is generally reduced to as small as 150 μm to 80 μm.

After the front wafer surface process in which a semiconductor element is formed on and/or into a front surface of the semiconductor substrate is completed, the thickness of a wafer which is a semiconductor substrate is reduced, and etching is performed for the formation of via-holes which pass through the substrate for forming electrical connection between the front surface and a back surface of the substrate. In addition, a back wafer surface process such as metal plating on the back wafer surface is performed. In this process, in order to prevent cracking of the thinned wafer, it is bonded to a reinforcing plate made of quartz glass or silicon with an adhesive such as an electron wax, thereby performing the back wafer surface process while the mechanical strength of the thinned wafer is increased.

In this case, upon completion of the back wafer surface process, the unnecessary reinforcing plate must be removed or peeled from the thinned wafer. Since no appropriate conventional apparatus for removing the reinforcing plate is available, this operation has been manually performed.

When the diameter of a GaAs wafer is increased from 3 to 4 inches, it is very difficult to peel the wafer from the reinforcing plate without any damage to the wafer. A product yield in the wafer peeling process tends to be decreased even by a skilled operator.

SUMMARY OF THE INVENTION

It is, therefore, an object of the present invention to solve the conventional problem described above and to provide an apparatus for peeling a semiconductor substrate from a reinforcing plate.

It is one object of the present invention to provide an apparatus for peeling a semiconductor substrate from a reinforcing plate bonded to the semiconductor substrate with an adhesion, comprising:

a fixing unit adapted for fixing the reinforcing plate; a pushing unit for pushing the semiconductor substrate in a direction substantially parallel to a bonding surface thereby to peel the semiconductor substrate from the reinforcing plate; and a monitor unit for monitoring a stress generated in the semiconductor substrate in accordance with electrical characteristics of a monitor circuit provided in the semiconductor substrate.

It is further object of the invention to provide an apparatus for peeling a semiconductor substrate from a reinforcing plate bonded on the semiconductor substrate with an adhesion, comprising: a fixing unit adapted for fixing the reinforcing plate; a pushing member adapted to be brought into contact with an edge of the semiconductor substrate, and for moving the semiconductor substrate in a direction substantially parallel to a bonding surface; a driving unit for driving the pushing member; a monitor unit for monitoring a stress generated in the semiconductor substrate; and a control unit for controlling driving of the driving unit on the basis of the monitored stress.

It is a further object of the invention to provide an apparatus for peeling a semiconductor substrate from a reinforcing plate bonded on the semiconductor substrate with an adhesion, comprising: a fixing unit adapted for fixing the reinforcing plate; a pushing member adapted to be brought into contact with an end face of the semiconductor substrate, for moving the semiconductor substrate in a direction substantially parallel to a bonding surface; a driving unit for driving the pushing member; a monitor unit for monitoring a load applied to the semiconductor substrate; and a control unit for controlling driving of the driving unit on the basis of the monitored load.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENT

Figure 1:
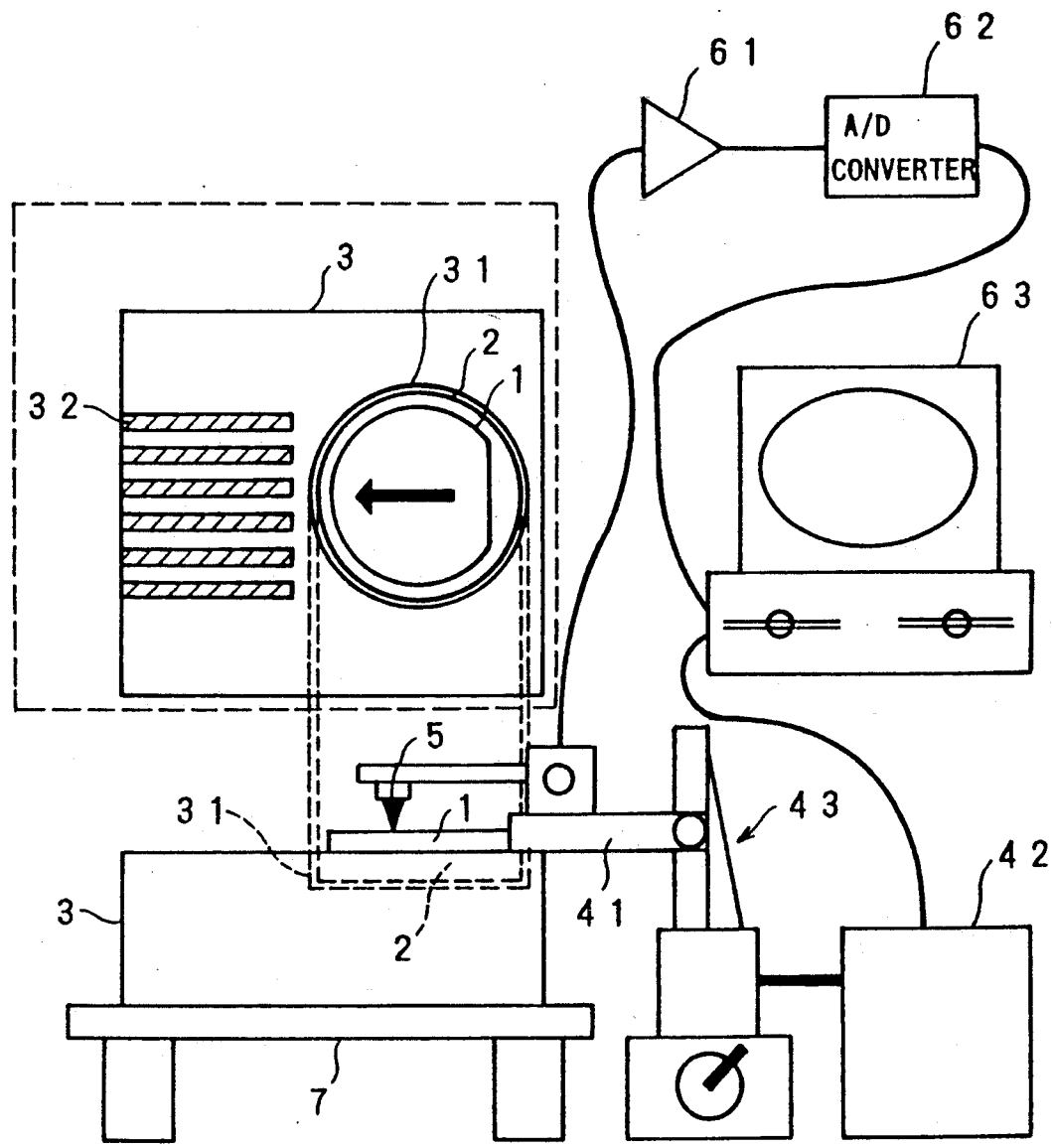
FIG. 1 is a view showing a system configuration of an apparatus for peeling a semiconductor substrate according to the first embodiment of the present invention and a plan view of a plate fixing jig viewed from the top.

The first embodiment of the present invention will be described with reference to FIGS. 1 to 2H. FIG. 1 is a view showing an arrangement of a peeling apparatus of this embodiment, and FIGS. 2A to 2H are sectional views showing the steps in the back surface process of an MMIC.

Figure 2A:
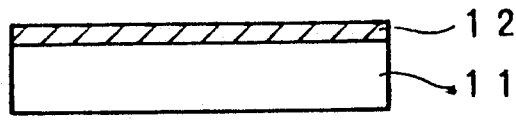
FIGS. 2A to 2H are sectional views showing the steps in a back surface process of an MMIC.
Figure 2B:
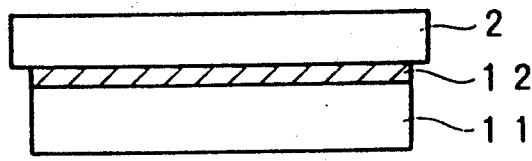
Figure 2C:
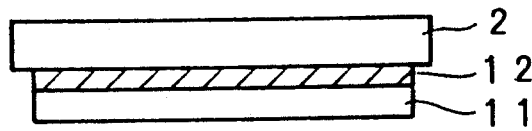

Referring to FIG. 2A, a resist 12 is applied to a GaAs substrate 11 upon completion of an front surface process. The front surface of this GaAs substrate 11 is bonded to a reinforcing plate 2 made of quartz glass or silicon with an adhesive such as an electron wax (FIG. 2B). The adhesive used here is not melted at a temperature of about 80° C. and is sufficiently softened at a temperature of about 130° C. This adhesive is an organic adhesive which has an ultrasonic transmission property. The organic adhesive is not dissolved in an etching solution in formation of via-holes and has a resistance to sputtering in a back surface process.

Figure 2D:
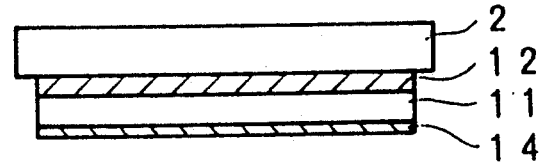
Figure 2E:
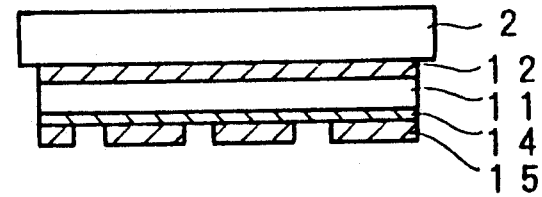
Figure 2F:
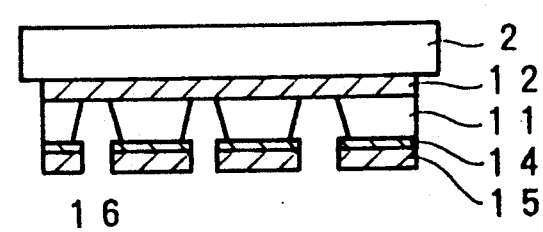
Figure 2G:
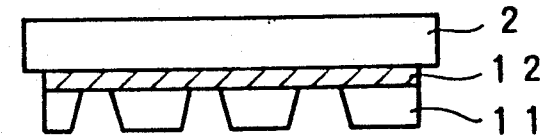
Figure 2H:
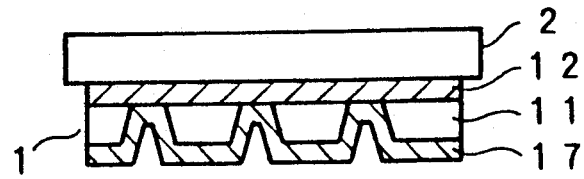

The back surface of the GaAs substrate 11 is polished to reduce its thickness (FIG. 2C), and an $SiO_2$ film 14 is formed by sputtering (FIG. 2D). A resist film 15 is coated on the $SiO_2$ film 14 and is patterned (FIG. 2E). The $SiO_2$ film 14 is etched using this resist pattern as a mask. Via-holes 16 are formed using this etched $SiO_2$ film 14 as a mask. Further metal film 17 is formed on the back surface of the substrate and the metal film 17 is patterned so that terminals of a monitoring circuit such as a FET of which electric characteristics is changed in accordance with the mechanical stress generated in the substrate and formed on the front surface side of the substrate, are electrically connected to output terminals formed on the back surface through via-holes 16. The resist film 15 and the $SiO_2$ film 14 are removed (FIG. 2G), and the metal film 17 is formed on the back surface by deposition or plating (FIG. 2H).

When a series of a back surface process in which the above operations are applied to the back surface of the semiconductor substrate, has been completed, a semiconductor wafer 1 is peeled from a reinforcing plate 2 by the peeling apparatus according to the present invention.

FIG. 1 shows the system arrangement of the peeling apparatus. The peeling apparatus of this embodiment includes a plate fixing jig 3, a wafer push rod 41, an electrical characteristic measurement probe 5, and a computer 63. A portion surrounded by dashed lines of FIG. 1 shows a enlarged plane view of the plate fixing jig 3.

The wafer push rod 41 is attached to a manipulator 43 driven by a motor 42. Under the control of the computer 63, the moving speed of the wafer push rod 41 can be changed. The electrical characteristic measurement probe 5 is attached to the wafer push rod 41 and is moved together with the movement of the wafer 1 by the wafer push rod 41. The probe 5 is contacted to the output terminals formed on the back surface of the substrate for measuring the electrical characteristics of the monitoring circuit formed on the front surface of the wafer. The monitor circuit is not limited to any specific arrangement if its electrical characteristics are changed in accordance with the magnitude of a stress generated by the wafer 1. For example, a threshold voltage $V_{th}$ of an FET is changed in accordance with the magnitude of the stress acting on the wafer 1, so that the change in threshold voltage can be utilized. Alternatively, a TEG (Test Element Group) is generally formed every plurality of locations on the wafer or every chip, and a circuit in the TEG is used as a monitor circuit in this embodiment.

Since the stress is almost uniformly applied to the entire surface of the wafer 1, a monitoring position is the central position of the wafer 1 or a position which is close to the wafer push rod 41 and which is kept adhered last to the reinforcing plate 2 during peeling. However, monitoring may be performed at a plurality of positions. A signal extracted from the monitor circuit is amplified by an amplifier 61. The amplified signal is A/D-converted by an A/D converter 62. The digital signal is then supplied to the computer 63.

The peeling apparatus is placed on a hot plate 7 and is heated to a temperature of about 130° C. to melt the adhesion bonding between the wafer 1 and the reinforcing plate 2, for example called as an electron wax. For this reason, the plate fixing jig 3 preferably has a low heat conductivity and comprises a relatively heavy member. For example, a nickel-plated brass member can be used as the plate fixing jig 3. A recessed portion 31 conforming the shape of the reinforcing plate 2 is formed in the jig 3. The reinforcing plate 2 is properly fitted in the recessed portion 31. The depth of the recessed portion 31 is set to be 0.5 mm with respect to the 0.6-mm thick reinforcing plate 2.

A portion for pushing the wafer 1 is brought into tight contact with the orientation flat of the wafer 1 and may have a shape of quadrangular prism. This portion may be made of a material which will not be deformed upon heating.

A jig portion onto which the pushed wafer 1 is moved in the pushing direction has slits 32 to prevent the wafer 1 from adhering to the jig 3 again. For this purpose, air is supplied upward from the back surface of the wafer 1.

FIG. 3 and FIGS. 4A to 4C show the second embodiment, and the second embodiment will be described with reference to these accompanying drawings.

Figure 3:
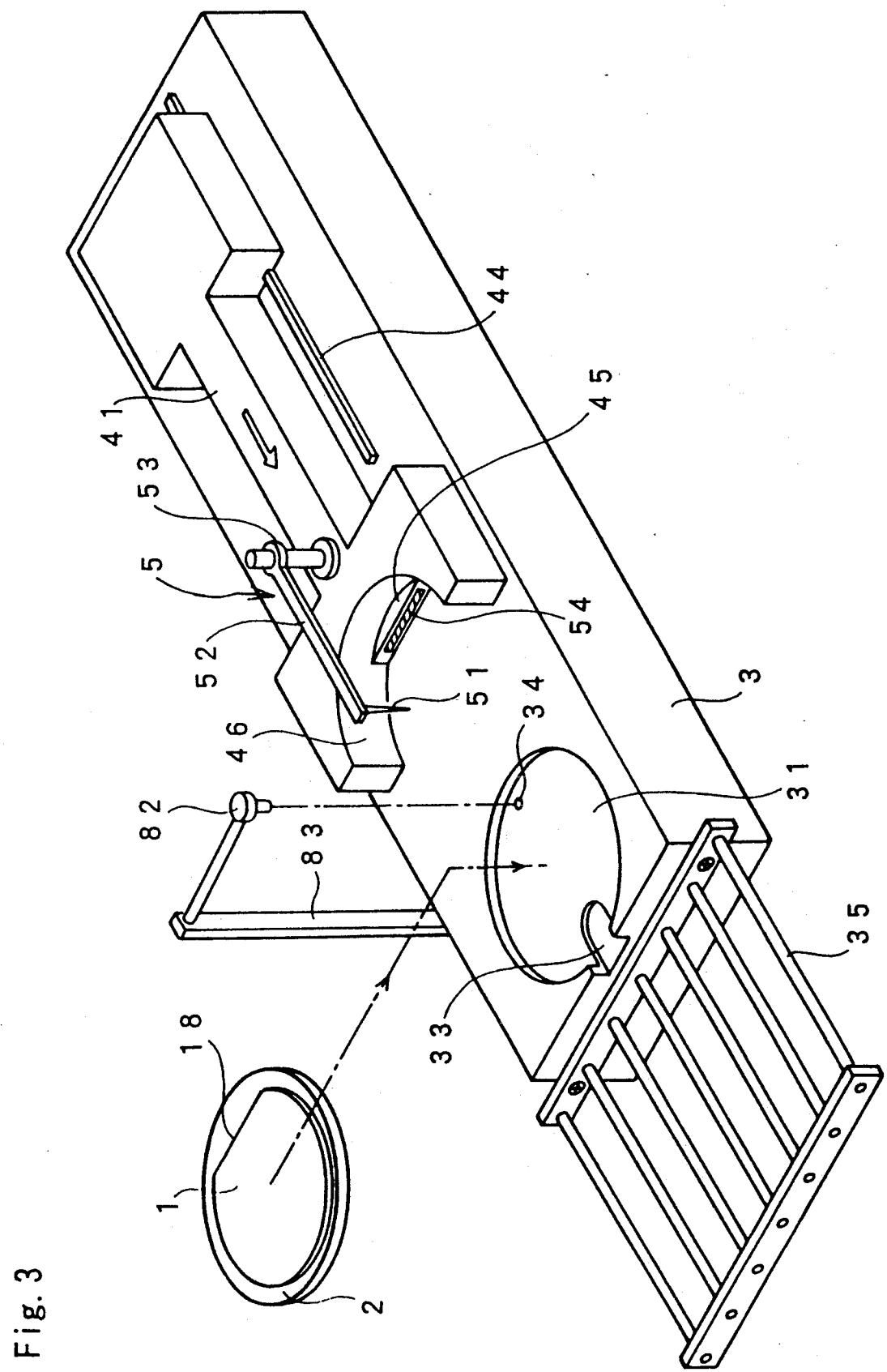
FIG. 3 is a perspective view of an apparatus for peeling a semiconductor substrate according to the second embodiment of the present invention.
Figure 4A:
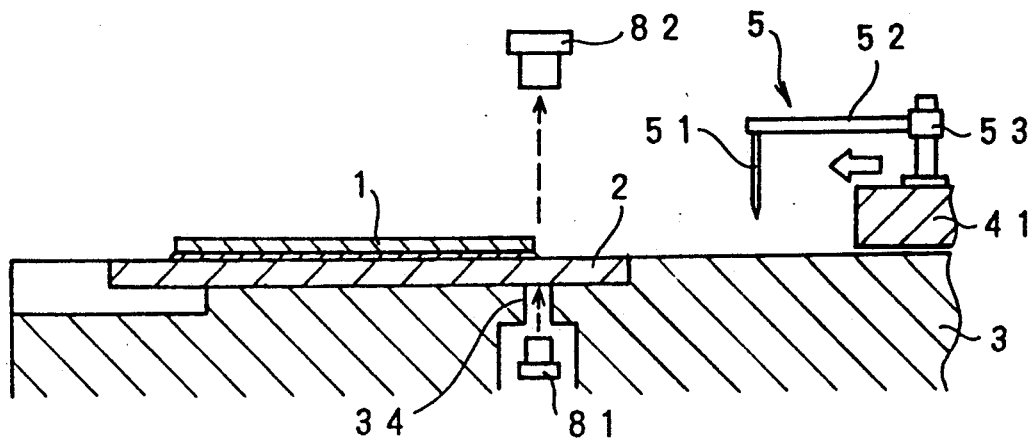
FIGS. 4A to 4C are sectional views of the apparatus for peeling a semiconductor substrate of the second embodiment along the center line.
Figure 4B:
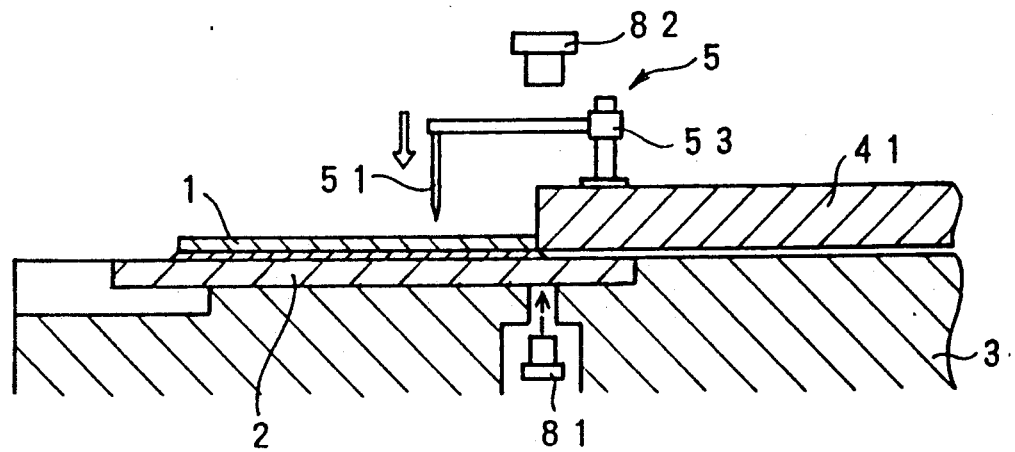
Figure 4C:
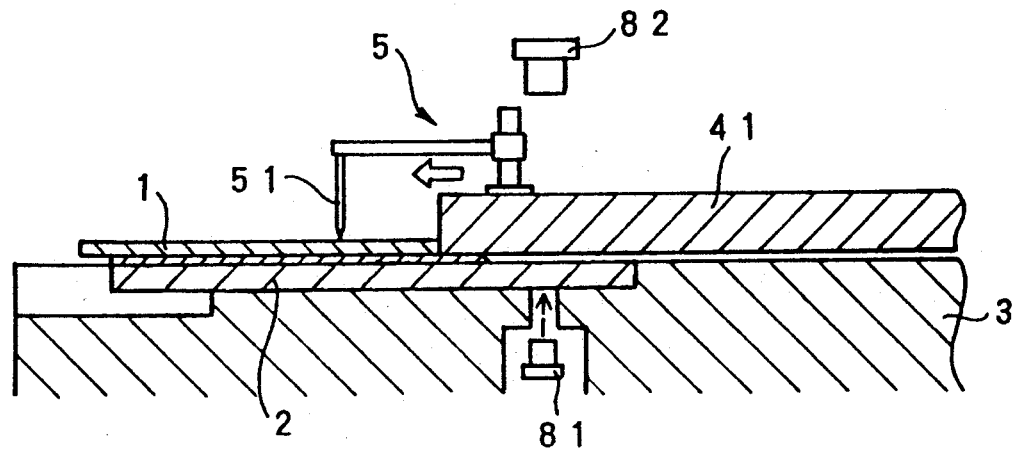

FIG. 3 is a perspective view of the second embodiment, and FIGS. 4A to 4C are sectional views along the center line of FIG. 3. FIG. 4A shows a state before a push rod is brought into contact with a semiconductor wafer, FIG. 4B shows a state in which the push rod is in contact with the semiconductor wafer, and a probe is connected to a monitor circuit, and FIG. 4C shows a state in which the semiconductor wafer is being pushed upon contact between the push rod and the semiconductor wafer.

A reinforcing plate 2 adhered to the semiconductor substrate (i.e., a wafer 1) described with reference to FIGS. 4A to 4C is fitted in a recessed portion 31 provided in a plate fixing jig 3a shown in FIG. 3 such that an orientation flat 18 of the wafer 1 faces a pushing means. Another recessed portion 33 continues from the recessed portion 31 toward the pushing direction, so that loading/unloading of the reinforcing plate 2 can be facilitated. A heating unit (not shown) is arranged below the recessed portion 31 to heat an adhesive to about 130° C.

A wafer push rod 41 is driven by a manipulator (not shown) controlled by a computer (not shown) and is moved along guide rails 44 formed on the table of the plate fixing jig 3. The wafer push rod 41 comprise an orientation flat (OF) pusher 45 which is brought into contact with the orientation flat 18 of the wafer 1 and a wafer pusher 46 which surrounds the OF pusher 45. A probe 5 comprising a probe tip 51, an arm 52, and a vertical moving mechanism 53 is mounted on the wafer push rod 41.

An optical opening 34 is formed in the recessed portion 31 at a position immediately below the orientation flat 18. An LED 81 is arranged to face upward to cause light to pass through this opening 34. A photodiode 82 for detecting light from the LED 81 faces downward and is mounted on a sensor column 83. In a normal state, the reinforcing plate 2 comprises a light-transmitting substrate such as a quartz plate, and the wafer 1 does not transmit light therethrough.

Before the wafer push rod 41 is brought into contact with the wafer 1, light emitted from the LED 81 and leaking from a gap between the wafer push rod 41 and the wafer 1 is detected by the photodiode 82 (FIG. 4A). When the wafer push rod 41 which is moving toward the wafer 1 is brought into contact with the wafer 1, light from the gap is shielded, and the light-shielding state is detected by the photodiode 82. The probe tip 51 is moved downward by the vertical moving mechanism 53 and is contacted with the output terminals of the monitoring circuit which are provided on the back surface of the wafer 1 (FIG. 4B). This contacting operation may be performed during movement of the wafer push rod 41, or may be performed when movement is temporarily interrupted. Thereafter, until the wafer 1 is peeled from the reinforcing plate 2, the probe 5 keeps measuring the stresses generated in the wafer 1 and is kept moved together with the wafer push rod 41, i.e., the wafer 1 (FIG. 4C).

The wafer 1 pushed and peeled from the reinforcing plate 2 is placed on rods 35 fixed to the table of the plate fixing jig 3.

The arrangements of the monitor circuit and a control system are the same as those in the first embodiment.

An actual peeling operation will be described below. The wafer 1 is set in the plate fixing jig 3. At this time, the reinforcing plate 2 is accurately fitted into the recessed portion 31 of the jig 3.

As described above, the operations of the peeling apparatus are controlled by a computer 63. The computer 63 stores a control program having a program for receiving a signal corresponding to a stress generated by the wafer 1 and processing this signal, and a program for controlling a speed for causing the wafer push rod 41 to push the wafer 1 by changing the speed of a motor 42 for driving a manipulator 43. By executing this control program, the peeling operation is performed.

The wafer 1 is pushed at an appropriate initial speed. The initial speed is about 10 $\mu$m/sec because care must be taken for initially pushing the wafer 1. When the wafer 1 is pushed by 10 $\mu$m, electrical characteristics of the wafer 1 are measured to determine whether a stress exceeding a breakdown limit acts on the wafer 1. A relationship between the electrical characteristics and the stress exceeding the breakdown limit must be measured in a preliminary experiment in advance.

If no stress exceeding the breakdown limit acts on the wafer 1, the speed for pushing the wafer 1 is doubled, i.e., 20 $\mu$m/sec. When the wafer 1 is pushed by another 10 $\mu$m, the electrical characteristics of the wafer 1 are measured to determine whether the stress exceeding the breakdown limit acts on the wafer 1. If no stress exceeding the breakdown limit acts on the wafer 1, the speed for pushing he wafer 1 is doubled again, i.e., 40 $\mu$m/sec. The above operations are repeated unless the stress exceeding the breakdown limit acts on the wafer 1, thereby increasing the speed for pushing the wafer 1. If the stress exceeding the breakdown limit acts on the wafer 1 in the above repetition, the speed for pushing the wafer 1 is halved.

As described above, in a state wherein the reinforcing plate 2 is kept fixed on the jig 3, the wafer 1 is pushed while the stress acting thereon is kept checked. Therefore, the wafer 1 can be peeled from the reinforcing plate 2 without damaging the wafer 1.

The magnitude of the initial speed for pushing the wafer 1, a moving distance of the wafer 1 between measurements of electrical characteristics of the wafer 1, and degrees of acceleration and deceleration are not limited to the specific values described in the above embodiment. These may be appropriately determined in accordance with a size of the wafer 1, a type of adhesive, and other conditions.

In the above embodiment, the stress generated in the wafer 1 is detected by the use of the monitoring circuit formed on the front surface of the wafer 1, but instead of the detection of the stress generated in the wafer, on the basis of the detection of the load to be applied to the wafer, the pushing speed of the wafer push rod may be controlled. In this case, a load cell 54 for detecting the load applied to the wafer push rod is attached to the rod. The output of the load cell 54 is detected and the pushing speed of the load is controlled on the basis of the detected output.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. An apparatus for peeling a semiconductor substrate from a reinforcing plate bonded to the semiconductor substrate with an adhesion, comprising:
   fixing means adapted for fixing the reinforcing plate;
   pushing means for pushing the semiconductor substrate in a direction substantially parallel to a bonding surface thereby to peel the semiconductor substrate from the reinforcing plate; and
   monitor means for monitoring a stress generated in the semiconductor substrate in accordance with electrical characteristics of a monitor circuit provided in the semiconductor substrate.

2. An apparatus according to claim 1, wherein said fixing means comprise a heating unit adapted for melting the adhesive.

3. An apparatus according to claim 1, wherein said fixing means includes a stage adapted for supporting the reinforcing plate and a recessed portion of which depth is not more than a thickness of the reinforcing plate and the adhesion, and adapted for receiving the reinforcing plate therein.

4. An apparatus according to claim 1, wherein said fixing means includes a stage for supporting the reinforcing plate and a projecting portion of which height is not more than a thickness of the reinforcing plate.

5. An apparatus according to claim 1, wherein said pushing means comprises a pushing member adapted to be brought into contact with an edge of the semiconductor substrate, and moving means for moving said pushing member.

6. An apparatus according to claim 5, wherein said pushing member has a flat portion adapted to be brought into contact with an orientation flat portion of said semiconductor substrate.

7. An apparatus according to claim 1, wherein
a monitor semiconductor circuit whose electrical characteristics are changed in accordance with a magnitude of a stress is formed in the semiconductor substrate in advance, and
said monitor means comprises a probe adapted to be contacted with terminals of the monitor circuit provided in the semiconductor substrate and a unit for measuring a change in electrical signal output from said probe.

8. An apparatus according to claim 7, wherein said monitor circuit is a circuit of a test element group formed in the semiconductor substrate.

9. An apparatus according to claim 7, wherein said monitor circuit comprises an FET formed on the semiconductor substrate.

10. An apparatus according to claim 5, further comprising a sensor for detecting contact between said pushing member and the semiconductor substrate.

11. An apparatus according to claim 10, wherein said sensor comprises a light-emitting or light-detecting unit located above a contact position where said pushing member is brought into contact with said semiconductor substrate for the first time, a light-detecting or light-emitting element located below the contact position, and light emitted from said light-emitting unit is non-transparent to said semiconductor substrate but are transparent to said reinforcing plate.

12. An apparatus according to claim 10, wherein
the monitor circuit whose electrical characteristics are changed in accordance with a magnitude of a stress is formed in said semiconductor substrate in advance, and
said monitor means comprises a probe adapted to be contacted to the monitor circuit and a unit for measuring a change in electrical signal output from said probe; and further comprising
probe descending means for moving said probe downward to contact said probe to the terminals of said monitor circuit when said sensor detects the contact between said pushing member and the semiconductor substrate.

13. An apparatus according to claim 12, wherein, when the sensor detects the contact between said pushing member and the semiconductor substrate, said pushing member is temporarily stopped and said probe descending means is energized.

14. An apparatus according to claim 12, wherein said probe is moved together with said pushing member.

15. An apparatus for peeling a semiconductor substrate from a reinforcing plate bonded on the semiconductor substrate with an adhesion, comprising:
fixing means adapted for fixing the reinforcing plate;
a pushing member adapted to be brought into contact with an edge of the semiconductor substrate, and for moving the semiconductor substrate in a direction substantially parallel to a bonding surface;
driving means for driving said pushing member;
monitor means for monitoring a stress generated in the semiconductor substrate; and
control means for controlling driving of said driving means on the basis of the monitored stress.

16. An apparatus according to claim 15, wherein said control means controls said driving means so that the stress monitored by said monitoring means does not exceed a predetermined value.

17. An apparatus according to claim 16, wherein said control means decreases a moving speed of said pushing member when the stress is not less than the predetermined value, and increases the moving speed of said pushing member when the stress is less than the predetermined value.

18. An apparatus for peeling a semiconductor substrate from a reinforcing plate bonded on the semiconductor substrate with an adhesion, comprising:
fixing means adapted for fixing the reinforcing plate;
a pushing member adapted to be brought into contact with an end face of said semiconductor substrate, for moving said semiconductor substrate in a direction substantially parallel to a bonding surface;
driving means for driving said pushing member;
monitor means for monitoring a load applied to the semiconductor substrate; and
control means for controlling driving of said driving means on the basis of the monitored load.

19. An apparatus for peeling a semiconductor substrate according to claim 18, wherein said monitor means comprises a load cell attached to a pushing member.

* * * * *